United States Patent [19]

Drechsel

[11] Patent Number: 5,234,664

[45] Date of Patent: Aug. 10, 1993

[54] DEVICE FOR PULLING CRYSTALS

[75] Inventor: Dieter Drechsel, Bruchköbel, Fed. Rep. of Germany

[73] Assignee: Leybold Aktiengesellschaft, Hanau, Fed. Rep. of Germany

[21] Appl. No.: 747,531

[22] Filed: Aug. 20, 1991

[30] Foreign Application Priority Data

Jul. 15, 1991 [DE] Fed. Rep. of Germany ....... 4123337

[51] Int. Cl.$^5$ .............................................. B01J 17/10
[52] U.S. Cl. ................................... 422/249; 156/600; 156/601; 156/617.1; 156/DIG. 91; 156/DIG. 98; 156/618.1; 422/252
[58] Field of Search ................. 156/600, 601, 617.126, 156/18.1, DIG. 91, DIG. 98; 422/249, 252

[56] References Cited

U.S. PATENT DOCUMENTS

| | | | |
|---|---|---|---|
| 4,190,630 | 2/1980 | Apilat et al. | 156/DIG. 98 |
| 4,569,828 | 2/1986 | Nishizawa | 156/DIG. 98 |
| 5,009,864 | 4/1991 | Ibe et al. | 422/249 |
| 5,089,239 | 2/1992 | Mizuishi et al. | 422/249 |

FOREIGN PATENT DOCUMENTS 0396284 11/1990 European Pat. Off. .
1519898 3/1969 Fed. Rep. of Germany .
2-279586 11/1990 Japan .

OTHER PUBLICATIONS

JP 2-279586A In: Patent Abstracts of Japan, C-802, Feb. 5, 1991, vol. 15/No. 48.

Primary Examiner—Robert Kunemund
Assistant Examiner—Felisa Garrett
Attorney, Agent, or Firm—Felfe & Lynch

[57] ABSTRACT

A pulling shaft carries a seed crystal holder and moves it vertically to pull a crystal upward from a melt in a crucible. The pulling shaft is rotated by a drive to cause the crystal to rotate while being pulled. A slippage device is provided to permit a difference between rotational speeds of the pulling shaft and the seed crystal. The slippage device may be incorporated in a crystal holder having an inner holder fixed to the seed crystal, an outer holder fixed to the shaft, and a friction bearing therebetween which prevents undue torsional stress from being transmitted to the crystal.

10 Claims, 2 Drawing Sheets

DEVICE FOR PULLING CRYSTALS

BACKGROUND OF THE INVENTION

The invention relates to an apparatus for pulling crystals with a rotating pulling shaft, preferably from the melt, especially a monocrystal pulling apparatus.

In the crystal growing field a great number of different processes are known, for example crystal growing from the gas phase, from the solution or from the melt. The various processes for crystal growing from the melt have attained a leading position over other growing methods on account of their greatly developed technology and productivity.

In crystal growing from the melt, a great variety of crucible processes are being used. For example, there is the so-called Kyropoulos process, which is characterized by the immersion of a chilled seed crystal in the melt. There is also the so-called Czochralski process in which a crystal is pulled from the melt. Also there is the Bridgman process, which is characterized by a vertical lowering of a crucible in the temperature gradient. Lastly, there is vertical zone melting without a crucible.

The subject matter of the invention is widely applicable in all crystal pulling apparatus with rotating pulling shaft, in which rotary vibrations can occur in the area of the thin-necked pulling shaft crystal, or in which there is danger that the crystal may break during the pulling process. These rotary vibrations occur on account of the elasticity of the so-called "thin neck."

In Leybold's publication No. 45-100.02, entitled "Crystal Growing," apparatus and processes for pulling crystals from the melt are described. This state of the art can serve as the starting point of the present invention.

FIG. 9 of Leybold's prospectus shows a production system with a rotating pulling shaft which permits a very stable crystal pulling process, especially at the higher rotatory speeds of the shaft.

The subject matter of the present invention has to do exclusively with the pulling shaft system.

In such systems the following disadvantages occur in practice:

Rotary vibrations occur between the pulling shaft and the growing crystal due to torsion in the elastic "thin neck," which is in the hot state. This is especially the case as the weight of the pulled crystal increases. There are resonance phenomena which intensify the undesirable rotary vibrations. These rotary vibrations are superimposed on the crystal rotation. The crystal speeds ahead and lags behind the rotating pulling shaft. This interferes with the perfect, stable pulling process. These harmful rotary vibrations can increase to the point of breaking the thin neck, and allowing the crystal to fall into the melt.

The danger of breaking off the crystal exists also when the rotation of the pulling shaft is abruptly stopped due to a power failure.

SUMMARY OF THE INVENTION

Conditions are to be created so that the rotary vibrations of the growing crystal are prevented. Furthermore, breaking off of the crystal during the pulling process, for example due to the sudden stopping of the motor driving the pulling shaft, is to be prevented.

Between the driving pulling shaft and the driven seed crystal (nucleator) or driven seed crystal holder, a damping device and/or a device for preventing breakage of the crystal is provided, which damps or prevents vibrations, especially rotary vibrations, during the crystal pulling process, and eliminates the breaking off of the crystal.

The device is preferably a slippage means which permits a relative difference between the circumferential speed of the pulling shaft and the circumferential speed of the seed crystal or seed crystal holder.

The device should permit turning by a certain angle of rotation between the pulling shaft and the seed crystal or seed crystal holder.

A structurally compact solution is achieved by high-temperature-resistant bearing disposed between the pulling shaft and the seed crystal or seed crystal holder.

In this embodiment it is additionally proposed that the bearing be designed with a break-loose torque and/or frictional torque resistance which on the one hand is sufficiently great for the seed crystal or seed crystal holder to be driven by the rotating pulling shaft, and on the other hand is low enough to permit relative rotations between the pulling shaft and the seed crystal or seed crystal holder without breaking the thin neck.

In a preferred embodiment is proposed that the bearing be a rolling bearing.

The use of a serrated swivel ball bearing has proven especially practical.

Furthermore, a multiple thrust bearing can be used. This multiple thrust bearing can be a multiple serrated swivel ball bearing. In that case determining the number of individual bearings permits the establishment of a particular break-loose torque and/or total rotatory torque resistance and thus a particular damping effect.

Furthermore, the use of the following bearings is proposed:

Angled axial ball bearings, shoulder axial ball bearings, self-aligning axial ball bearings, axial taper roller bearings, barrel-shaped axial roller bearings, pendular barrel-shaped roller bearings, pendular axial roller bearings, needle thrust bearings.

Besides rolling bearings, friction bearings can also be used, which are configured as axial friction bearings.

It is proposed that the friction bearing material of the axial friction bearing be made of heat-resistant, nonlubricated friction bearing material, especially carbon, preferably fiber-reinforced graphite.

The basic idea of the invention can also be carried out by connecting directly or indirectly, a twistable body (torsion body) which offers little or no inherent torque to torsional stress, at one end to the bottom end of the pulling shaft and at the other end to the upper end of the seed crystal or seed crystal holder so that the torsion body will permit relative rotation between the pulling shaft on the one hand and the seed crystal or seed crystal holder on the other.

An additional basic idea of the invention consists in designing the damping device as a slipping clutch.

An especially compact structure is achieved by having the turning means—for example the torsion body or the slipping clutch—contained in a casing-like part of the seed crystal holder.

In a preferred embodiment the seed crystal holder consists of a sleeve-like casing (outer part of the seed crystal holder) and a sleeve (inner part of the seed crystal holder) attached to the seed crystal. The outer part of the seed crystal holder is joined to the bottom end of the pulling shaft, especially by screwing, and the inner part of the seed crystal holder is joined, especially by interlocking, to the upper end of the seed crystal. Between an outer, axial-thrust-withstanding body edge of the inner part of the seed crystal holder, and an axial-thrust-withstanding body edge on the inner wall of the outer part of the seed crystal holder, there is disposed a serrated swivel ball bearing which is axially loaded during the pulling process and permits a rotation of the bottom end of the pulling shaft relative to the seed crystal.

In this connection it is proposed that the inner part of the seed crystal holder consist of two shells, preferably half-shells, which are pressed against the upper end of the seed crystal especially by wire elements, so that an interlocking coupling between the seed crystal and the inner part of the seed crystal holder is produced.

It is furthermore proposed that the upper end of the seed crystal holder have an annular groove engaged by an annular projection on the inner wall of the inner part of the seed crystal holder, and that the shells of the inner part of the crystal holder consist of carbon, especially fiber-reinforced graphite. The bearing can be made from ceramic.

The following advantages are achieved by the invention:

The undesirable rotary vibrations of the growing crystal are prevented. Also, precautions are taken to prevent the crystal from breaking off during the pulling process, for example due to stoppage of the pulling shaft motor. The subject matter of the invention is universally applicable in crystal pulling apparatus with rotating pulling shaft. A high operating reliability of the apparatus is achieved by economical technical means.

DETAILED DESCRIPTION OF THE PREFERRED EMBODIMENT

Figure 1:
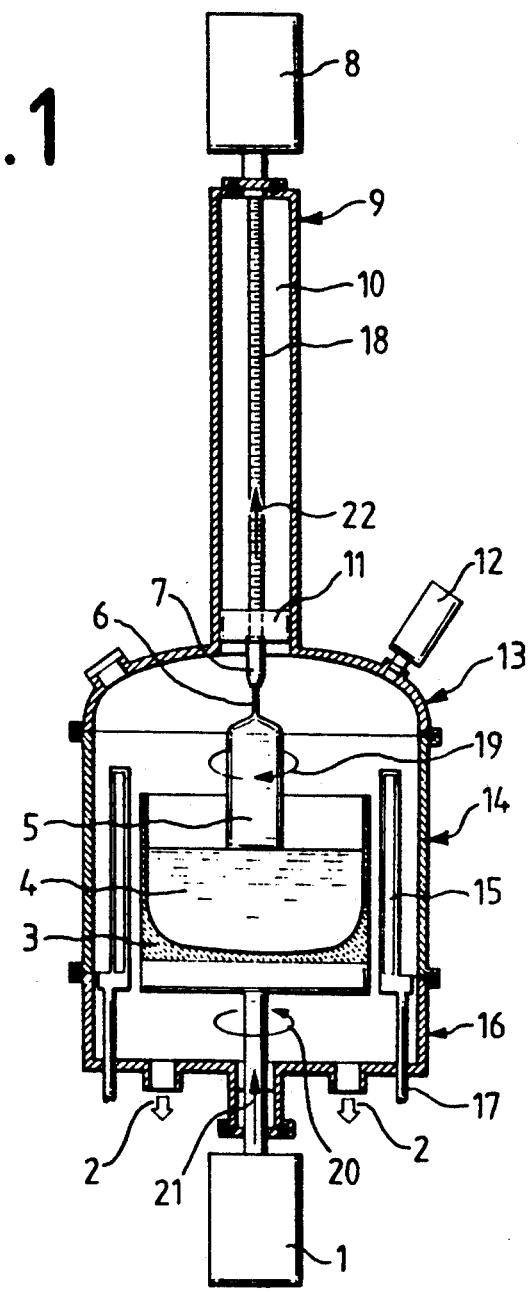
FIG. 1 shows an apparatus for pulling crystals with a rotating pulling rod according to the state of the art.

In FIG. 1, the mechanism 1 rotates the crucible 3 containing melt 4 from which crystal 5 is pulled. The seed crystal or nucleator 6 is held by the seed crystal holder 7.

The crystal drive 8 drives the pulling shaft 18 in lock chamber 10; the lock valve 11 is illustrated diagrammatically in the top of pulling ball 13, which is fixed to furnace body 14. Inert gas enters into the lock chamber 10 via inlet 9 and is exhausted via outlets 2. An optical sensor 12 measures the position of the surface of the melt 4. The power input 17 for the heating system 15 passes through furnace bottom 16.

Additional structural details of apparatus for crystal pulling and technical details on the process can be found in the Leybold publication referred to above. Mention is also made of German patent disclosure document 3904858.

The crystal pulling process runs substantially in accordance with FIG. 1 as follows, this being what is known as the "Czochralski process":

The starting material melts in the crucible 3. The seed crystal 6 dips into the melt 4 and is wetted by it, i.e., begins to fuse. Then the seed crystal is pulled upwardly out of the melt. At first the thin neck (also indicated at 6 in FIG. 1) is formed, which is made to merge into the actual crystal of greater diameter by controlling the process accordingly. On the pulling shaft 18 is the seed crystal holder 7, which pulls the seed crystal and at the same time rotates it. The crucible also rotates. The crystal and the crucible rotate in opposite senses. In FIG. 1 the rotation of the crystal is indicated by the arrow 19. The arrow 20 indicates the rotation of the crucible. During the pulling process the crucible is raised. This is represented by the arrow 21. Also, during the pulling process, the rotating pulling shaft 18 is drawn upward. This is indicated by the arrow 22.

Figure 2:
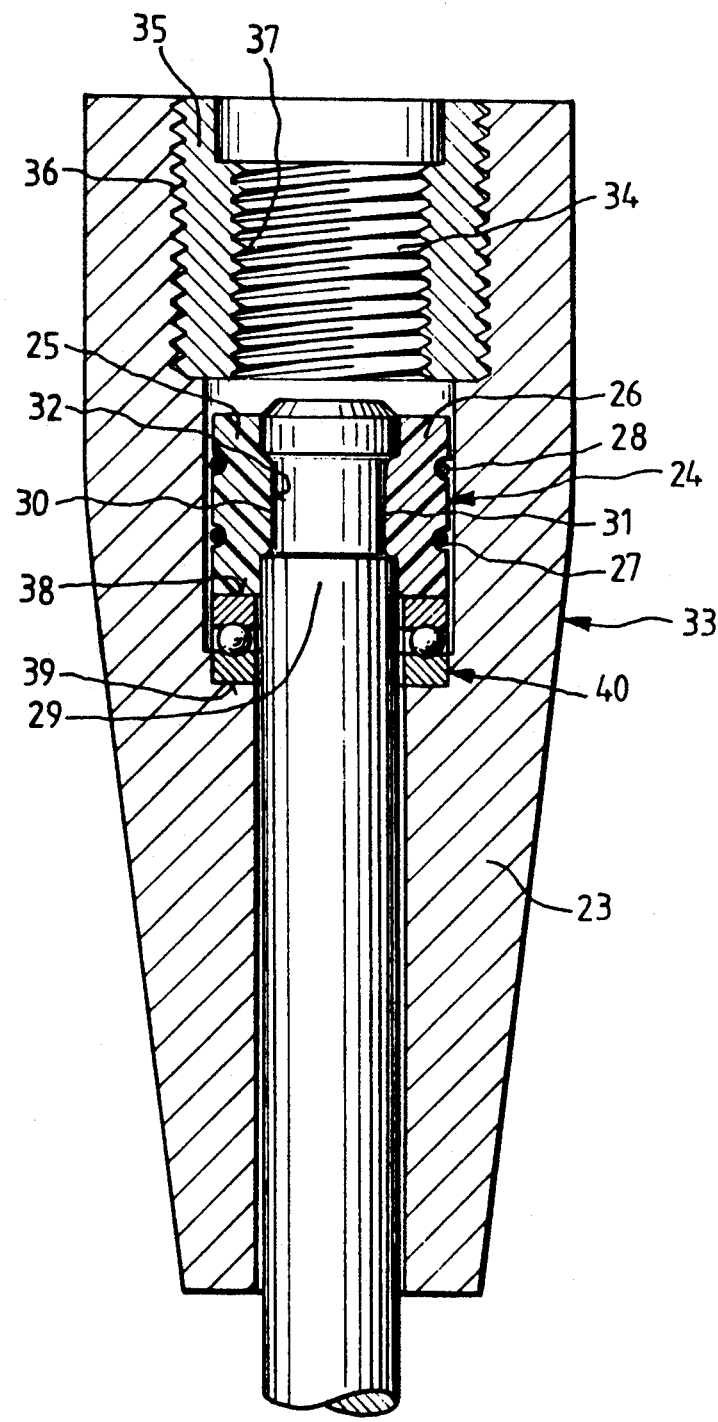
FIG. 2 shows an example of the embodiment of the invention.

FIG. 2 is an enlarged sectional view of the seed crystal holder. It consists of a sleeve-like casing (outer seed crystal holder) 23. This piece surrounds the inner seed crystal holder, which is designated in its entirety by 24. The inner seed crystal holder includes two shells 25 and 26 of fiber-reinforced graphite held together by wires 27 and 28 and clamped around the upper end 29 of the seed crystal.

Between the upper end of the seed crystal and the two shells 25 and 26 there is a form-fitting relationship: the projections 30 and 31 of the two shells enter into an annular groove 32 at the upper end 29 of the seed crystal.

The seed crystal holder 33 is attached to the bottom end 34 of the revolving pulling shaft by screw threads 37.

In particular, a sleeve 35 is provided, which on the one hand is joined to the crystal holder by the screw thread 36 and on the other hand is screwed by means of screw thread 37 onto the bottom end of the pulling shaft. Between the end 38 of the two shells 25 and 26 and the seat 39 in the inner wall of the outer seed crystal holder 23 there is fitted a ball bearing 40. This ball bearing permits a relative rotation between the pulling shaft and the seed crystal. The ball bearing is made of ceramic and configured especially as a serrated axial ball bearing.

I claim:

1. Apparatus for pulling a crystal upward from a melt, said apparatus comprising
   seed crystal holding means for fixing to a seed crystal attached to the crystal to be pulled upward,
   a pulling shaft which holds said seed crystal holding means and moves it upward to pull said crystal upward from the melt,
   drive means for rotating said pulling shaft, and
   slippage means between said pulling shaft and said seed crystal, said slippage means permitting a difference between rotational speeds of said pulling shaft and said seed crystal.

2. Apparatus as in claim 1 wherein said seed crystal holding means comprises an inner holder fixed to said seed crystal and an outer holder fixed to said pulling shaft, said slippage means being situated between said inner holder and said outer holder.

3. Apparatus as in claim 2 wherein said slippage means comprises a bearing having a frictional torque resistance which permits the inner holder to be rotated by the pulling shaft.

4. Apparatus as in claim 3 wherein said bearing is an axial bearing.

5. Apparatus as in claim 3 wherein said bearing comprises a heat resistant, non-lubricated friction bearing material.

6. Apparatus as in claim 5 wherein said bearing material is fiber-reinforced graphite.

7. Apparatus as in claim 5 wherein said bearing material is ceramic.

8. Apparatus as in claim 1 wherein said slippage means causes said seed crystal to rotate at the same speed as said pulling shaft until said pulling shaft is subjected to a threshold torque.

9. Apparatus as in claim 1 wherein said slippage means comprises a torsion body offering no torsional stress.

10. Apparatus as in claim 9 wherein said slippage means comprises a slip clutch.

* * * * *